(12) United States Patent
Dickey

(10) Patent No.: US 6,897,092 B2
(45) Date of Patent: May 24, 2005

(54) METHOD OF SUPPORTING A SUBSTRATE FILM

(75) Inventor: Brenton L. Dickey, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/461,548

(22) Filed: Jun. 12, 2003

(65) Prior Publication Data

US 2003/0190769 A1 Oct. 9, 2003

Related U.S. Application Data

(60) Continuation of application No. 09/858,118, filed on May 15, 2001, now abandoned, which is a division of application No. 09/389,720, filed on Sep. 3, 1999.

(51) Int. Cl.[7] .................. H01L 21/44; H01L 23/495
(52) U.S. Cl. .................. 438/111; 438/110; 438/111; 438/107; 257/667; 257/670
(58) Field of Search .................. 257/667, 670; 438/110, 111, 107

(56) References Cited

U.S. PATENT DOCUMENTS

| 511,935 A | 1/1894 | Criswell |
|---|---|---|
| 3,774,232 A | 11/1973 | May |
| 3,942,245 A | 3/1976 | Jackson et al. |
| 4,878,991 A | 11/1989 | Eichelberger et al. |
| 5,023,202 A | 6/1991 | Long et al. |

(Continued)

FOREIGN PATENT DOCUMENTS

| JP | 358074064 | * | 5/1983 |
|---|---|---|---|
| JP | 58-178544 A | | 10/1983 |
| JP | 60-46059 | * | 3/1985 |
| JP | 6-177315 A | | 6/1994 |
| JP | 11-176886 A | | 7/1999 |
| JP | 11-274348 | * | 11/1999 |
| JP | 11-180291 A | | 1/2001 |

OTHER PUBLICATIONS

Harris Semiconductor, "Lexicon—B." (http://rel.semi.harris.com/docs/lexicon/B.htm), 4 pages, Mar. 2, 1999.
Harris Semiconductor, "Lexicon—C." (http://rel.semi.harris.com/docs/lexicon/C.htm), 8 pages, Apr. 17, 1999.
Harris Semiconductor, "Lexicon—E." (http://rel.semi.harris.com/docs/lexicon/E.htm), 3 pages, Apr. 17, 1999.
Harris Semiconductor, "Lexicon—I." (http://rel.semi.harris.com/docs/lexicon/I.htm), 3 pages, Apr. 17, 1999.
Harris Semiconductor, "Lexicon—P." (http://rel.semi.harris.com/docs/lexicon/P.htm), 5 pages, Feb. 25, 1999.
Harris Semiconductor, "Lexicon—S." (http://rel.semi.harris.com/docs/lexicon/S.htm), 10 pages, Apr. 17, 1999.
Harris Semiconductor, "Lexicon—W." (http://rel.semi.harris.com/docs/lexicon/B.htm), 1 page, Mar. 2, 1999.

*Primary Examiner*—Erik Kielin
*Assistant Examiner*—James Mitchell
(74) *Attorney, Agent, or Firm*—Knobbe Martens Olson & Bear, LLP

(57) ABSTRACT

The invention relates to a carrier for supporting a substrate film during the chip-substrate assembly and bonding process. The carrier provides enhanced rigidity to the substrate film. The degree of rigidity and/or flexibility provided can be controlled by selection of the carrier dimensions, configuration and material choice. Advantages of embodiments of the carrier include easier handling, reduced probability of defective end products, and increased control in choosing the thinness of the substrate film. For example, the substrate film carrier can be used for lead-over-chip (LOC) assemblies and lead-under-chip (LUC) assemblies to create ball grid arrays (BGA), pin grid arrays (PGA), dual in-line packages (DIP), and the like.

5 Claims, 5 Drawing Sheets

U.S. PATENT DOCUMENTS

| | | | |
|---|---|---|---|
| 5,075,760 A | 12/1991 | Nakashima et al. | |
| 5,111,935 A | 5/1992 | Bond et al. | |
| 5,170,328 A | 12/1992 | Kruppa | |
| 5,173,766 A | 12/1992 | Long et al. | |
| 5,196,725 A | 3/1993 | Mita et al. | |
| 5,216,278 A | 6/1993 | Lin et al. | |
| 5,286,679 A | 2/1994 | Farnsworth et al. | |
| 5,359,222 A | 10/1994 | Okutomo et al. | |
| 5,472,085 A | 12/1995 | Gelzer | |
| 5,474,957 A | 12/1995 | Urushima | |
| 5,545,922 A | 8/1996 | Golwalkar et al. | |
| 5,585,600 A | 12/1996 | Froebel et al. | |
| 5,661,086 A | 8/1997 | Nakashima et al. | |
| 5,677,566 A | 10/1997 | King et al. | |
| 5,726,491 A | 3/1998 | Tajima et al. | |
| 5,756,377 A | 6/1998 | Ohsawa | |
| 5,789,820 A * | 8/1998 | Yamashita | 257/787 |
| 5,796,586 A | 8/1998 | Lee et al. | |
| 5,841,194 A | 11/1998 | Tsukamoto | |
| 5,844,168 A | 12/1998 | Schueller et al. | |
| 5,847,445 A | 12/1998 | Wark et al. | |
| 5,898,214 A | 4/1999 | Miura | |
| 5,925,926 A | 7/1999 | Watanabe | |
| 5,945,834 A * | 8/1999 | Nakata et al. | 324/754 |
| 5,951,804 A | 9/1999 | Kweon et al. | |
| 5,952,711 A | 9/1999 | Wohlin et al. | |
| 5,977,617 A | 11/1999 | Kata | |
| 5,980,683 A | 11/1999 | Beck et al. | |
| 6,013,946 A | 1/2000 | Lee et al. | |
| 6,036,173 A | 3/2000 | Neu et al. | |
| 6,057,174 A | 5/2000 | Hashimoto | |
| 6,087,202 A | 7/2000 | Exposito et al. | |
| 6,091,140 A | 7/2000 | Toh et al. | |
| 6,097,098 A | 8/2000 | Ball | |
| 6,111,324 A | 8/2000 | Sheppard et al. | |
| 6,118,183 A | 9/2000 | Umehara et al. | |
| 6,144,102 A | 11/2000 | Amagai | |
| 6,179,127 B1 | 1/2001 | Kato et al. | |
| 6,199,743 B1 | 3/2001 | Bettinger et al. | |
| 6,240,632 B1 | 6/2001 | Ito et al. | |
| 6,249,046 B1 | 6/2001 | Hashimoto | |
| 6,256,762 B1 | 7/2001 | Beppu | |
| 6,258,621 B1 | 7/2001 | Ohuchi et al. | |
| 6,268,646 B1 | 7/2001 | Sugimoto et al. | |
| 6,284,569 B1 | 9/2001 | Sheppard et al. | |
| 6,303,219 B1 * | 10/2001 | Sawamura et al. | 428/343 |
| 6,306,687 B1 | 10/2001 | Corisis et al. | |
| 6,319,354 B1 | 11/2001 | Farnworth et al. | |
| 6,323,541 B1 | 11/2001 | Huang et al. | |
| 6,353,268 B1 | 3/2002 | Cobbley et al. | |
| 6,362,637 B2 * | 3/2002 | Farnworth et al. | 324/755 |
| 6,379,745 B1 | 4/2002 | Kyod et al. | |
| 6,426,548 B1 | 7/2002 | Mita et al. | |
| 6,455,354 B1 | 9/2002 | Jiang | |
| 6,465,876 B1 | 10/2002 | Kitano et al. | |
| 6,670,696 B2 * | 12/2003 | Toyosawa et al. | 257/667 |
| 2002/0033524 A1 | 3/2002 | Toyosawa et al. | |

\* cited by examiner

METHOD OF SUPPORTING A SUBSTRATE FILM

RELATED APPLICATIONS

This application is a continuation of U.S. application Ser. No. 09/858,118, filed May 15, 2001 now abandoned, which is a divisional of U.S. application Ser. No. 09/389,720, filed Sep. 3, 1999, the entirety of each one of which is hereby incorporated by reference herein.

BACKGROUND OF THE INVENTION

1. Field of the Invention

The present invention relates generally to the handling of semiconductor chips and, specifically, to a carrier adapted for supporting a substrate film during the assembly and bonding process.

2. Background

In today's integrated circuit (IC) technology, semiconductor chips or dies are typically batch fabricated on a silicon wafer. The wafer may contain hundreds of dies arranged in a matrix. The dies are separated and each die is typically mounted on an appropriate substrate, contacted, and packaged.

The substrate is typically a thin flexible tape or film reel which permits automated transport and handling of the dies. Many dies may be attached adjacently to a single tape using, for example, a suitable adhesive material. Bond pads on the dies and the substrate film allow the dies to be wire bonded or connected, using suitable leads, to the substrate. The die-substrate assemblies may then be cut into individual units. Each unit is packaged in a suitable medium with output leads, for example, ball grid arrays (BGA), pin grid arrays (PGA), dual in-line packages (DIP), and the like. The outputs of these packages allow interconnections to a similarly patterned arrangement of connections on a printed circuit board (PCB).

The thinness of the substrate film or tape is advantageous in that it does not significantly add to the weight and size of the end product. But this thinness can also cause the substrate film reel to be fragile and flimsy. As a result, during the assembly process, the film is prone to undesirable and/or unwanted bending and movement. This cannot only cause damage to the die, the substrate and the die-substrate interface, but can also complicate the handling and assembly of the die and substrate. For example, undesirable bending of the film substrate can result in breakage of one or more of the leads connecting the dies to the substrate.

SUMMARY OF THE INVENTION

The invention relates to a carrier for supporting a substrate film during the chip-substrate assembly and bonding process. The carrier provides enhanced rigidity to the substrate film. The degree of rigidity and/or flexibility provided can be controlled by selection of the carrier dimensions, configuration and material choice. Advantages of embodiments of the carrier include easier handling, reduced probability of defective end products, and increased control in choosing the thinness of the substrate film. For example, the substrate film carrier can be used for lead-over-chip (LOC) assemblies and lead-under-chip (LUC) assemblies to create ball grid arrays (BGA), pin grid arrays (PGA), dual in-line packages (DIP), and the like.

In one embodiment, a carrier for supporting a substrate film comprises side bars and cross bars. The side bars and cross bars are in mechanical communication with the substrate film and provide rigidity during the manufacturing process. In another embodiment, an assembly comprises a substrate film and a carrier. The carrier comprises side bars which are in mechanical communication with the substrate film.

In another embodiment, an assembly comprises a film and a carrier. The film includes a plurality of substrate units. The plurality of substrate units is adapted to electrically interface with a plurality of dies. The carrier is in mechanical communication with the film. The carrier provides enhanced rigidity to the film by being sized and configured to add material at selected regions of the film.

In another embodiment, an assembly for attachment of integrated circuits comprises a film, a plurality of dies and a carrier. The film includes a plurality of substrate units. The plurality of dies are in electrical contact with the plurality of substrate units. The carrier is in mechanical communication with the film for providing enhanced rigidity to the film.

One embodiment of the invention relates to method for supporting a substrate film. The method comprises connecting side bars to a substrate film and connecting cross bars to the substrate film, whereby the side bars and the cross bars provide rigidity during the manufacturing process.

Another embodiment relates to a method of manufacturing an assembly. The method comprises connecting side bars to a substrate film and transporting the side bars and the substrate film through a manufacturing process. The method further comprises removing the side bars after at least a portion of the manufacturing process.

An additional embodiment relates to a method of processing semiconductor dies. The method comprises forming a plurality of substrate units within a film and interfacing the substrate units with a plurality of dies. The method further comprises adding support material at selected regions of the film so as to provide enhanced rigidity to the substrate units. The method also comprises removing the support material at the completion of at least a portion of a manufacturing process.

One embodiment relates to a method of manufacturing integrated circuits. The method comprises forming a plurality of substrate units within a substrate film and interfacing a plurality of dies to the plurality of substrate units. The method further comprises connecting a carrier to the film to enhance the rigidity of the film.

For purposes of summarizing the invention, certain aspects, advantages and novel features of the invention have been described herein above. Of course, it is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

DETAILED DESCRIPTION OF THE PREFERRED EMBODIMENTS

Figure 1:
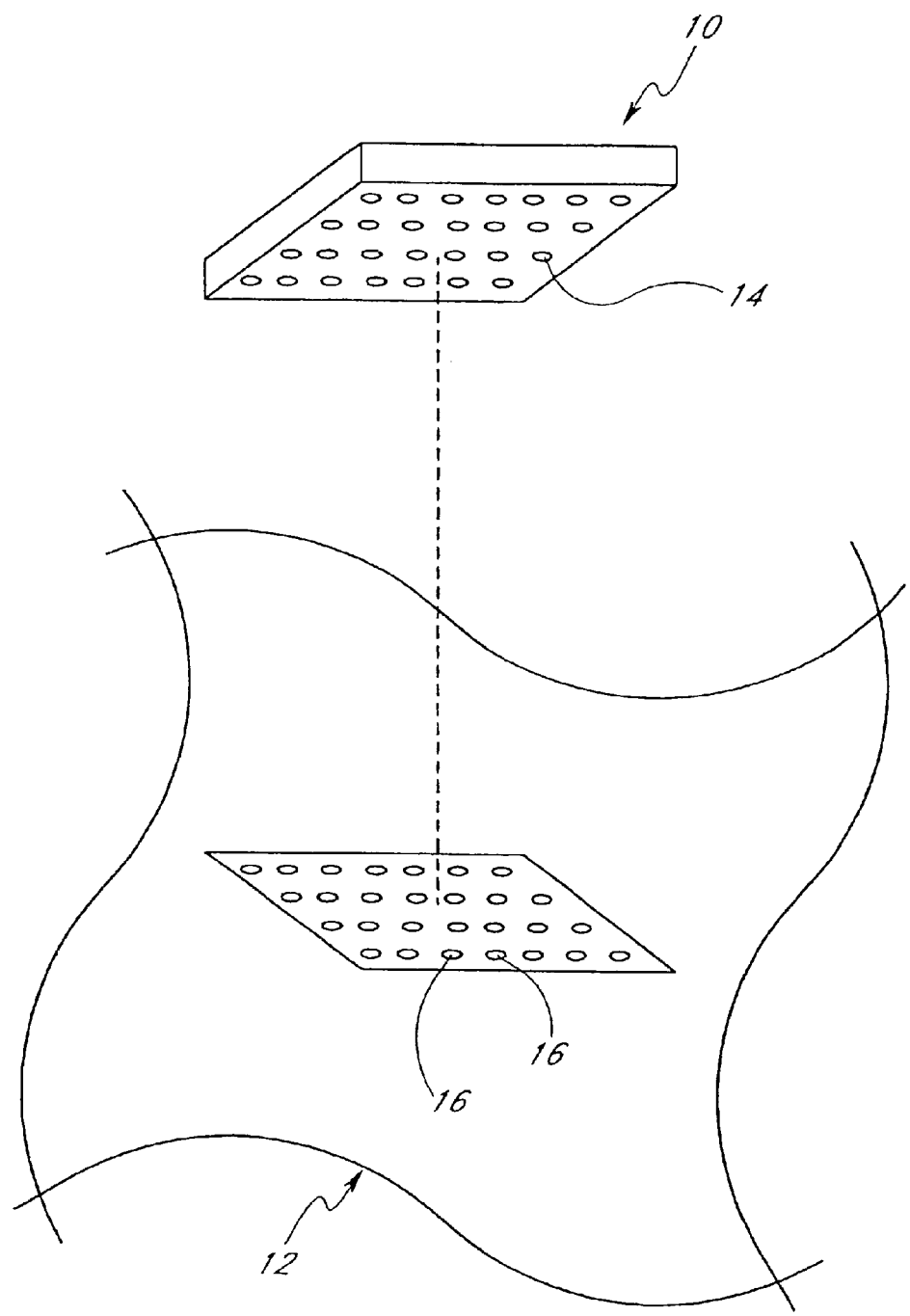
FIG. 1 is a schematic exploded perspective view of one embodiment of a ball grid array (BGA) chip package and a printed circuit board (PCB)

FIG. 1 schematically illustrates a ball grid array (BGA) chip package 10 and a printed circuit board (PCB) 12. The BGA package 10 serves as an encapsulating device for a die or chip and permits electrical access to the die via solder or electrode bumps 14. The PCB 12 includes a pattern of pads 16 which are arranged in alignment with the BGA solder bumps 14. This allows the BGA chip package 10 to be connected to the PCB 12. Of course, other chip packaging types may also be used, for example, pin grid arrays (PGA), dual in-line packages (DIP), and the like. These packaging types can be connected to compatible connectors on a PCB or other external circuitry.

Figure 2:
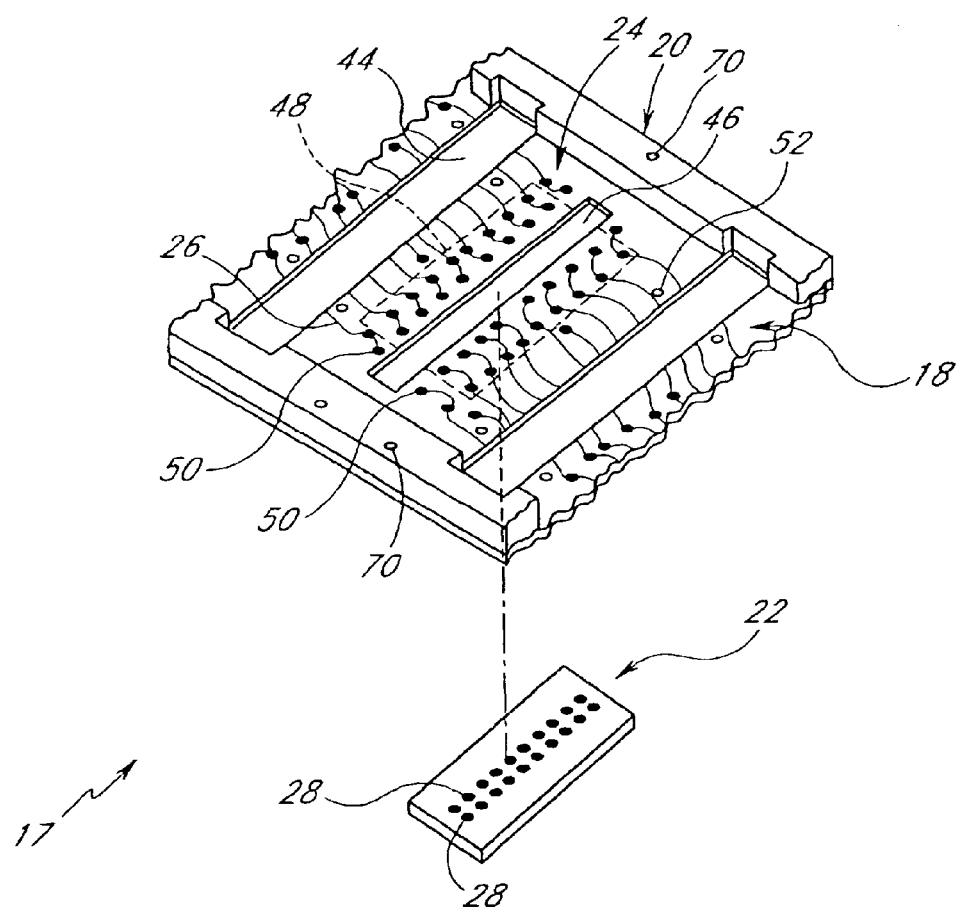
FIG. 2 is a partially exploded perspective view of a substrate film, carrier and lead-over-chip (LOC) die assembly in accordance with one embodiment of the present invention.

In accordance with one embodiment, FIG. 2 is a representation of a lead-over-chip (LOC) assembly 17 and generally shows a substrate film 18, a film carrier or structure 20 and a semiconductor die or chip 22. The substrate film 18 includes a plurality of substrate units 24, as discussed in greater detail below, with each unit 24 being interfaceable with an individual die 22. The die 22 includes a plurality of bonding pads 28 which are in electrical contact with the integrated circuits formed on the die 22. During assembly, the die 22 is adhered to the substrate unit 24 and the bonding pads 28 are electrically contacted to traces 26 formed on or in the substrate unit 24 through die lead wires (not shown). In turn, the LOC die-substrate assembly 17 is separated from the substrate film 18 and packaged, for example, in the BGA chip package 10 (FIG. 1) with the substrate electrical traces 26 in electrical contact with the solder bumps 14 (FIG. 1). This permits the die 22 to be electrically interfaced with external circuitry, for example, the PCB 12 (FIG. 1). The LOC die-substrate assembly 17 can also be packaged in other forms, for example and as indicated above, using pin grid arrays (PGA), dual in-line packages (DIP), and the like.

In general, the substrate film carrier 20 (FIG. 2) may be used in connection with various types of die-substrate assemblies to provide rigidity to the substrate film 18 (FIG. 2) during handling. In one embodiment, the substrate film carrier 20 is used in conjunction with a lead-under-chip (LUC). The structure of such LUC assemblies is well known in the art, and hence will not be discussed in detail herein.

The die attach materials and equipment are commercially available from suppliers such as Dow Corning, Hitachi and ShinEtsu, among others. The lead bond tools and equipment are commercially available from suppliers such as Gaiser, Hitachi, Shinkawa and others. The encapsulation materials and equipment are commercially available from suppliers such as Ablestick, Asymtek, Dow Corning, Hitachi, 3M, ShinEtsu and others.

Figure 3:
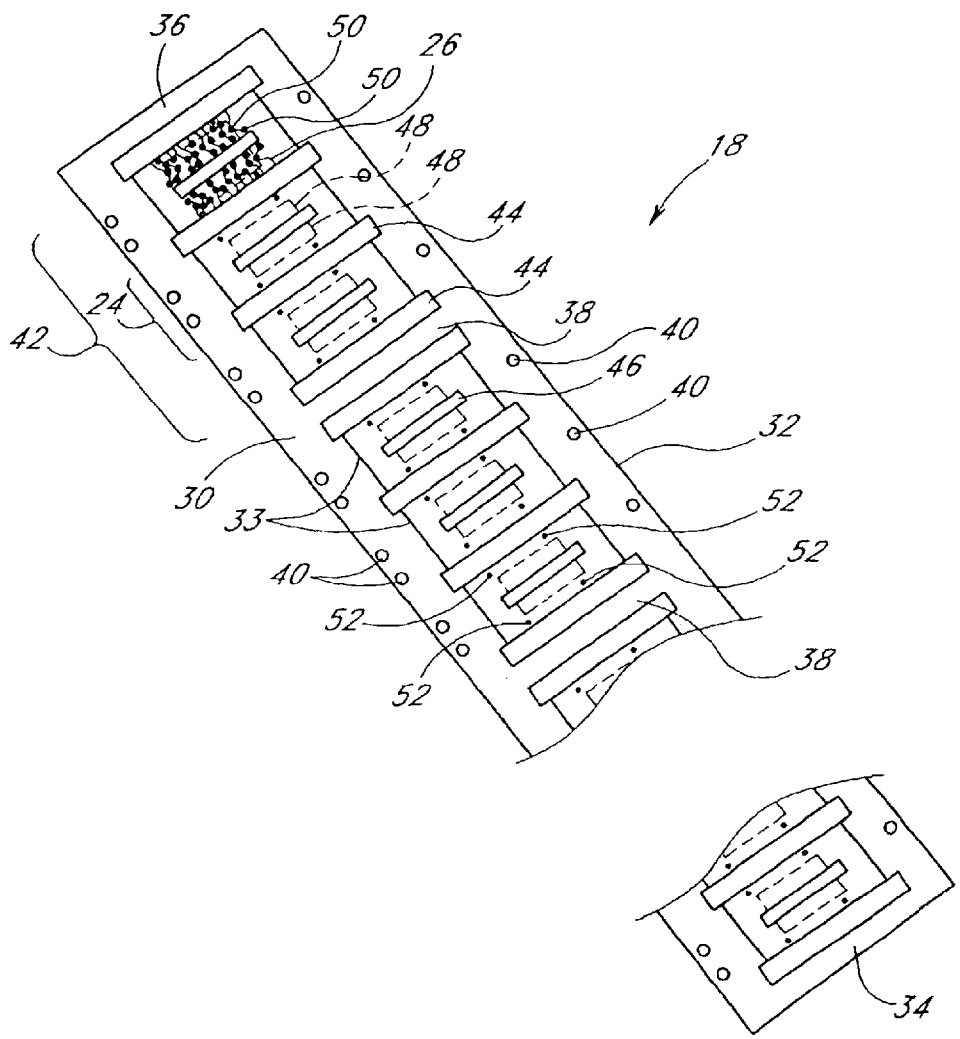
FIG. 3 is a top plan view of the substrate film of FIG. 2.

FIG. 3 shows a substrate film or tape 18 in accordance with one embodiment. The substrate film 18 generally includes a plurality of substrate units or elements 24, and side rails 30 and 32 which are interconnected by end rails 34 and 36 and a plurality of cross rails 38. The side rails 30, 32 have a plurality of indexing holes 40 that facilitate transport and indexing of the substrate film 18, for example, during automated assembling. In one embodiment, as shown in FIG. 3, the side rails 30, 32 also include projecting portions 33 which define two of the edges of the substrate units 24.

In one embodiment, the substrate film 18 (FIG. 3) includes eighteen substrate units 24 grouped in substrate sets 42 with each substrate set 42 including three substrate units 24. The cross rails 38 serve to space adjacent substrate sets 42. Those skilled in the art will readily recognize that the number of substrate units 24 in the substrate film 18 and the number of substrate units 24 forming each substrate set 42 can be increased or decreased with efficacy, as required or desired.

Referring to FIG. 3, each substrate unit 24 is flanked by a pair of spacing and/or separating slots 44. The substrate unit 24 includes a plurality of electrical traces 26 with bond pads 50 formed thereon, and a generally central cavity 46 adjacent to a pair of adhesive tabs 48 formed on the under-surface of the substrate film 18.

As indicated above, and with reference to FIGS. 2 and 3, the adhesive tabs 48 permit a plurality of dies, for example, the die 22, to be adhered to respective substrate units 24. The substrate unit cavity 46 is configured so that when the die 22 is in attachment with the substrate unit 24 the die bonding pads 28 are exposed. This allows die lead wires (not shown) to pass through the cavity 46 and be wire bonded to the die bonding pads 28 and corresponding substrate bond pads 50. In turn, other bond pads 50 in electrical contact with the electrical traces 26 permit the substrate unit 24, and hence the die 22, to be externally interfaced, for example, via the solder or electrode bumps 14 (FIG. 1).

The substrate bond pads 50 (FIGS. 2 and 3) can be connected to the solder bumps 14 (FIG. 1) in a number of ways as is known in the art, for example, by utilizing an interposer element within the chip packaging. In one embodiment, each substrate unit 24 also includes alignment holes 52 which facilitate alignment of the die-substrate assembly, for example, the LOC assembly 17 during encapsulation.

In one embodiment, the substrate film 18 (FIG. 3) is fabricated from polyimide. Such substrate films 18 are commercially available from a wide variety of sources, for example, 3M, Casio, Shinko, Rite Flex and others. Typically, the fabrication of the film or tape 18 begins with providing a polyimide tape which is sandwiched on either side by a layer of copper and an outer layer of solder resist/mask. The desired electrical "artwork" is then etched on the polyimide tape. The skilled artisan will understand, however, that a variety of other non-conductive materials and processes can be used to create the substrate film 18.

Referring to FIGS. 2 and 3, the wire bonding of the die lead wires (not shown) to the die bonding pads 28 and substrate bond pads 50 can utilize one of several methods known in the art. For example, thermal compression bonding, ultrasonic bonding, and pulse bonding may be used. The die lead wires are typically made out of either gold or aluminum, but other materials may be used, as required or desired, giving due consideration to the goal of providing reliable electrical contacts. The substrate bond pads 50 are fabricated from gold plated copper, though a variety of other materials can be used, as required or desired, giving due consideration to the goal of providing reliable electrical contacts.

Referring to FIG. 3, in one embodiment, the substrate film 18 has a thickness in the range from about 0.125 mm to 0.120 mm, a length in the range from about 182.03 mm to 182.93 mm and a width in the range from about 27.13 mm to 27.23 mm. However, in other embodiments, the skilled artisan will recognize that the substrate film 18 may be adapted to have a wide variety of other thicknesses, lengths and widths.

The side rails 30, 32 have a thickness in the range from about 0.125 mm to 0.120 mm, a length in the range from about 182.03 mm to 182.93 mm, and a width in the range from 27.13 mm to 27.23 mm. The side rail projecting portions 33 extend inwards about 4.32 mm and are about 6.63 wide. However, in other embodiments, the skilled artisan will recognize that the side rails 30, 32 may be adapted to have a wide variety of other dimensions.

The end rails 34, 36 have a thickness in the range from about 0.125 mm to 0.120 mm, a length in the range from about 27.13 mm to 27.23 mm, and a width in the range from about 1.03 mm to 1.11 mm. However, in other embodiments, the skilled artisan will recognize that the end rails 34, 36 may be adapted to have a wide variety of other dimensions.

The cross rails 38 have a thickness in the range from about 0.125 mm to 0.120 mm, a length in the range from about 27.13 mm to 27.23 mm, and a width in the range from about 2.11 mm to 2.21 mm. In one embodiment, the spacing between neighboring cross rails 38 is in the range from about 5.03 mm to 5.11 mm. However, in other embodiments, the skilled artisan will recognize that the cross rails 38 may be adapted to have a wide variety of other dimensions and spacings. In one embodiment, the substrate film 18 includes five cross rails 38. However, in other embodiments, the substrate film 18 may include fewer or more cross rails 38.

The slots 44 have a length in the range from about 18.49 mm to 18.59 mm and a width in the range from about 2.11 mm to 2.21 mm. In one embodiment, the spacing between neighboring slots 44 is in the range from about 5.03 mm to 5.11 mm. However, in other embodiments, the skilled artisan will recognize that the slots 44 may be adapted to have a wide variety of other dimensions and spacings. In one embodiment, the substrate film 18 includes seventeen slots 44. However, in other embodiments, the substrate film 18 may include fewer or more slots 44.

The cavities 46 have a length in the range from about 15.95 mm to 16.05 mm and a width in the range from about 7.95 mm to 8.05 mm. In one embodiment, the spacing between neighboring cavities 46 is in the range from about 10.11 mm to 10.21 mm. However, in other embodiments, the skilled artisan will recognize that the cavities 46 may be adapted to have a wide variety of other dimensions and spacings. In one embodiment, the substrate film 18 includes eighteen cavities 46. However, in other embodiments, the substrate film 18 may include fewer or more cavities 46.

The substrate units 24 have a thickness in the range from about 0.125 mm to 0.120 mm, a length in the range from about 182.03 mm to 182.93 mm, and a width in the range from about 27.13 mm to 27.23 mm. However, in other embodiments, the skilled artisan will recognize that the substrate units 24 may be adapted to have a wide variety of other dimensions. In one embodiment, the substrate film 18 includes eighteen substrate units 24. However, in other embodiments, the substrate film 18 may include fewer or more substrate units 24.

In one embodiment, the substrate film 18 includes six substrate sets 42. Each of the substrate sets 42 includes three substrate units 24. However, in other embodiments, the skilled artisan will realize that the substrate film 18 may include fewer or more substrate sets 42 and each substrate set 42 may include fewer or more substrate units 24.

The indexing holes 40 have a diameter in the range from about 1.574 mm to 1.499 mm. However, in other embodiments, the skilled artisan will recognize that the indexing holes 40 may be adapted to have a wide variety of other diameters. In one embodiment, each substrate unit 24 is associated with three indexing holes 40. However, in other embodiments, each substrate unit 24 may be associated with fewer or more indexing holes 40.

Figure 4:
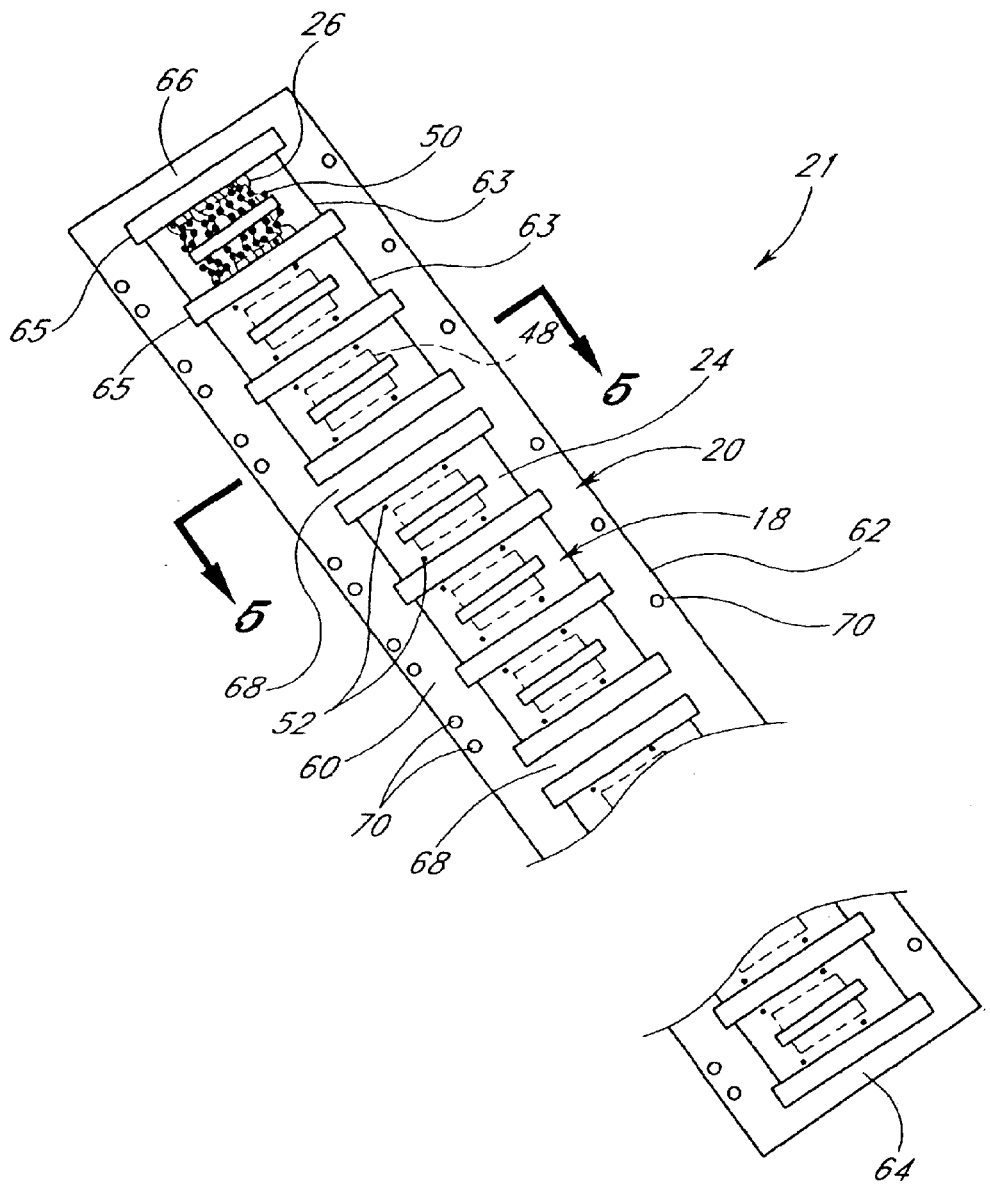
FIG. 4 is a top plan view of the substrate film and carrier of FIG. 2.

FIG. 4 shows the substrate film 18 supported by a carrier or structure 20 in accordance with one embodiment to form a carrier-film assembly 21. The substrate film carrier 20 provides increased rigidity for the substrate film 18 which facilitates handling and assembling processes. The carrier 20 generally includes side bars 60 and 62 which are interconnected by end bars 64 and 66 and a plurality of cross bars 68. The carrier side bars 60, 62 are substantially aligned with the film side rails 30, 32 (FIG. 3) and include teeth 63 to form notches 65.

The teeth 63 are substantially aligned with the side rail projecting portions 33 and the notches 65 are substantially aligned with the ends of the film slots 44. The carrier side bars 60, 62 also include indexing holes 70 which are substantially aligned with the film indexing holes 40. Similarly, the carrier end bars 64, 66 are substantially aligned with the film end rails 34, 36 and the carrier cross bars 68 are substantially aligned with the film cross rails 38.

Referring to FIGS. 3 and 4, the substrate film carrier 20 provides enhanced rigidity to the substrate film 18 by adding extra material on the film side rails 30, 32, film end rails 34, 36, and film cross rails 38. In one embodiment, this is achieved by providing a balance between flexibility and rigidity. The carrier-film assembly 21 is flexible enough so that it is easily handled by the processing machines but it is also rigid enough to provide sufficient support for the substrate film 18 during handling.

In one embodiment, and referring to FIG. 4, the carrier side bars 60, 62, carrier end bars 64, 66, and carrier cross bars 68 are dimensioned to have substantially the same thickness. In other embodiments, the carrier side bars 60, 62, carrier end bars 64, 66, and carrier cross bars 68 can have different thicknesses.

In one embodiment, the substrate film carrier 20 comprises only the side bars 60, 62. In another embodiment, the substrate film carrier 20 comprises only the cross bars 68. In yet another embodiment, the substrate film carrier 20 comprises the side bars 60, 62, and the cross bars 68. In a further embodiment, the substrate film carrier 20 comprises the side bars 60, 62, and the end bars 64, 66. In yet another further embodiment, the substrate film carrier 20 comprises the end bars 64, 66, and the cross bars 68.

Those skilled in the art will realize that the substrate film carrier 20 can be configured in many other ways, for example, and referring to FIG. 4, the teeth 63 or notches 65 shown on the carrier side bars 60, 62 can be removed. Also, the substrate film carrier 20 can be provided on the adhesive tab 48 side of the film 18 or on both sides of the film 18, giving due consideration to the goal of providing enhanced rigidity. The substrate film carrier 20 may also extend beyond the periphery and/or any edges of the film 18, as required or desired. Moreover, the film carrier can be constructed to adapt to the particular shapes and/or sizes of a wide range of substrate films, giving due consideration to the goals of providing length-wise and/or cross-wise support.

Figure 5:
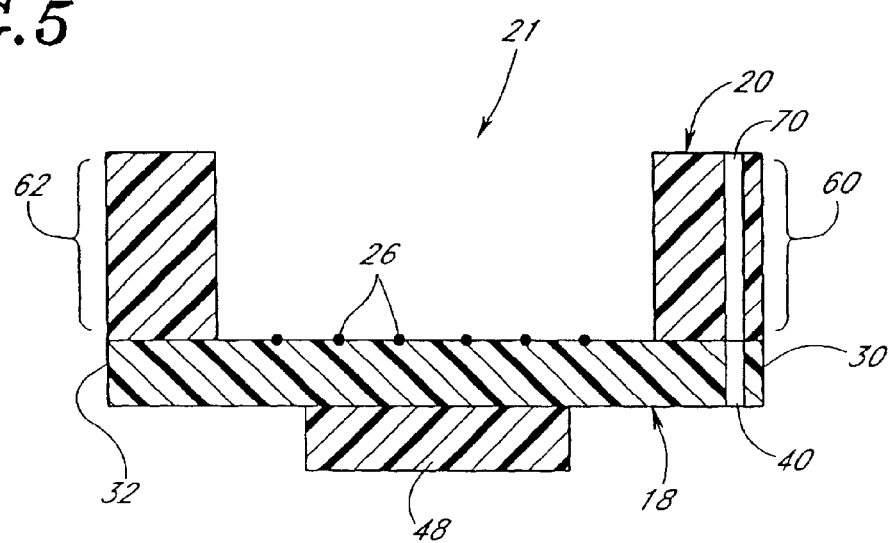
FIG. 5 is a schematic cross-sectional view along line 5—5 of FIG. 4 in accordance with one embodiment of the present invention.

In one embodiment, as shown in FIG. 5, the substrate film carrier 20 comprises a frame that is adhered to the substrate film 18 to form the carrier-film assembly 21. The carrier/frame 20 may be attached to the film 18 utilizing a wide variety of commercially available adhesive materials. In one embodiment the adhesive material is selected such that it can withstand a temperature of at least about 150 EC, for example, KAPTON, manufactured by 3M.

In one embodiment, the frame 20 is fabricated from BT resin. The skilled artisan will understand, however, that a variety of materials can be used for the substrate film carrier/frame 20 with efficacy, giving due consideration to the goal of providing enhanced rigidity for the substrate film 18 (FIG. 3). The frame 20 (FIG. 5), in one embodiment, can be manufactured by stamping a sheet of material in the desired shape and then punching the indexing holes 70 in suitable positions. However, the frame 20 may also be fabricated by other known manufacturing techniques.

In one embodiment, and referring to FIGS. 3, 4 and 5, the process of providing a packaged die, for example the BGA die package 10 (FIG. 1), generally begins with the fabrication of the substrate film 18. Side rails 30, 32, end rails 34, 36, cross rails 38, indexing holes 40, slots 44, cavities 46 and alignment holes 52 are created. The electrical "artwork" (electrical traces 26, bond pads 50) is formed on the film 18, in one embodiment, by an etching process. Adhesive tabs 48 are added to the film 18.

In one embodiment, and referring to FIGS. 4 and 5, a substrate film carrier/frame 20 is then formed. In one embodiment, the substrate film carrier/frame 20 is manufactured by stamping a sheet of material to provide side bars 60, 62, end bars 64, 66, and cross bars 68. The indexing holes 70 are punched into the carrier 20. The carrier/frame 20 is adhered to the film 18 and adds thickness to the film 18 at selected locations.

In one embodiment, and referring to FIGS. 4 and 5, dies 22 (FIG. 2) are adhered to respective substrate units 24 utilizing the adhesive tabs 48. The dies 22 are wire bonded to the electrical traces 26 on respective substrate units 24 to form a plurality of die-substrate assemblies, for example, the LOC assemblies 17 (FIG. 2). The die-substrate assemblies 17 are removed from the substrate film 18, for example, by cutting. The die-substrate assemblies 17 are then packaged and tested to provide, for example, the BGA die package 10 (FIG. 1).

In one embodiment, the substrate film carrier 20 has a thickness in the range from about 0.295 mm to 0.305 mm, a length in the range from about 182.03 mm to 182.93 mm and a width in the range from about 27.13 mm to 27.23 mm. However, in other embodiments, the skilled artisan will recognize that the substrate film carrier 20 may be adapted to have a wide variety of other thicknesses, lengths and widths.

The side bars 60, 62 have a thickness in the range from about 0.295 mm to 0.305 mm, a length in the range from about 182.03 mm to 182.93 mm, and a width in the range from about 3.22 mm to 3.32 mm. The side bar teeth 63 extend inwards about 1.07 mm and are about 7.95 mm wide. However, in other embodiments, the skilled artisan will recognize that the side bars 60, 62 may be adapted to have a wide variety of other dimensions.

The end bars 64, 66 have a thickness in the range from about 0.295 mm to 0.305 mm, a length in the range from about 27.13 mm to 27.23 mm, and a width in the range from about 1.03 mm to 1.11 mm. However, in other embodiments, the skilled artisan will recognize that the end bars 64, 66 may be adapted to have a wide variety of other dimensions.

The cross bars 68 have a thickness in the range from about 0.295 mm to 0.305 mm, a length in the range from about 27.13 mm to 27.23 mm, and a width in the range from about 2.11 mm to 2.21 mm. In one embodiment, the spacing between neighboring cross bars 68 is in the range from about 5.03 mm to 5.11 mm. However, in other embodiments, the skilled artisan will recognize that the cross bars 68 may be adapted to have a wide variety of other dimensions and spacings. In one embodiment, the substrate film carrier 20 includes five cross bars 68. However, in other embodiments, the substrate film carrier 20 may include fewer or more cross bars 68.

The carrier indexing holes 70 have a diameter in the range from about 1.574 mm to 1.499 mm. However, in other embodiments, the skilled artisan will recognize that the indexing holes 70 may be adapted to have a wide variety of other diameters. In one embodiment, the carrier 20 includes fifty-four indexing holes 70. However, in other embodiments, the substrate film carrier 20 may include fewer or more indexing holes 70.

Figure 6:
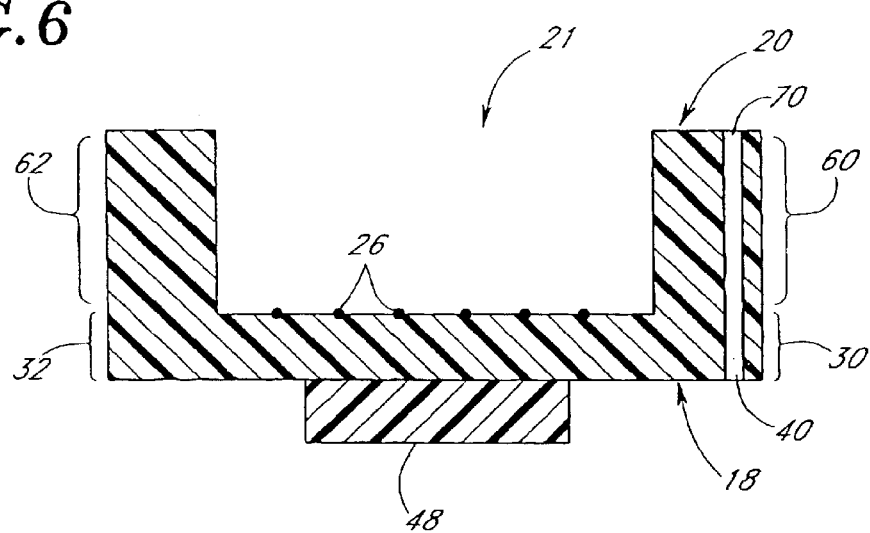
FIG. 6 is a schematic cross-sectional view along line 5—5 of FIG. 4 in accordance with another embodiment of the present invention.

In another embodiment, as shown in FIG. 6, the substrate film carrier 20 is formed with the substrate film 18 to create the carrier-film assembly 21. In one embodiment, the carrier 20 and the film 18 are fabricated from polyimide. The skilled artisan will understand, however, that a variety of materials can be used for the carrier 20 and the film 18. Referring to FIG. 6, the carrier 20 and the film 18 may be manufactured by using known techniques, such as molding.

In one embodiment, and referring to FIGS. 3, 4 and 6, the process of providing a packaged die, for example the BGA die package 10 (FIG. 1), generally begins with the fabrication of the substrate film 18 and the carrier 20. Side rails 30, 32, end rails 34, 36, cross rails 38, indexing holes 40, slots 44, cavities 46 and alignment holes 52 are created. Side bars 60, 62, end bars 64, 66, cross bars 68, and indexing holes 70 are created. In one embodiment, a molding process is utilized to form the carrier 20 with the film 18. The carrier 20 adds thickness to the film 18 at selected locations.

Referring to FIGS. 3, 4 and 6, in one embodiment, the electrical "artwork" (electrical traces 26, bond pads 50) is formed on the film 18. In one embodiment this "artwork" is formed by an etching process. Adhesive tabs 48 are added to the film 18.

In one embodiment, and referring to FIGS. 4 and 6, dies 22 (FIG. 2) are adhered to respective substrate units 24 utilizing the adhesive tabs 48. The dies 22 are wire bonded to the electrical traces 26 on respective substrate units 24 to form a plurality of die-substrate assemblies, for example, the LOC assemblies 17. The die-substrate assemblies 17 are removed from the substrate film 18, for example, by cutting. The die-substrate assemblies 17 are then packaged and tested to provide, for example, the BGA die package 10 (FIG. 1).

In one embodiment, the carrier 20 includes fifty-four indexing holes 70. However, in other embodiments, the substrate film carrier 20 may include fewer or more indexing holes 70.

Figure 7:
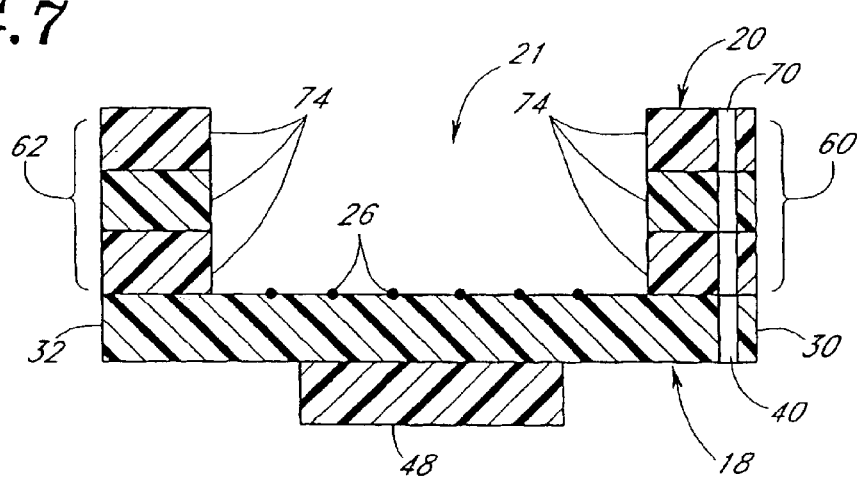
FIG. 7 is a schematic cross-sectional view along line 5—5 of FIG. 4 in accordance with another embodiment of the present invention.

In another embodiment, as shown in FIG. 7, the substrate film carrier 20 comprises a plurality of layers 74 of material. In one embodiment, the layers 74 are polyimide. In other embodiments, one or more of the layers 74 are metallic, for example, copper, and/or solder mask. These latter embodiments may be desirable especially in the situation, as indicated above, in which fabrication of the electrical "artwork" on the substrate film 18 utilizes layers of copper and solder resist.

For example, one or more layers 74 can be polyimide, one or more layers 74 can be copper, and one or more layers 74 can be solder mask. The thickness of each layer 74 can be controlled, as required or desired. Those skilled in the art will recognize that a number of materials may be used to fabricate the layered carrier 20 shown in FIG. 7.

For example, one or more layers 74 of material is provided to form side bars 60, 62, end bars 64, 66, and cross bars 68. The indexing holes 70 are punched into the carrier 20. As indicated above, the layers 74 may also be formed during the fabrication of the film 18 and can comprise copper and/or solder resist. The carrier 20 adds thickness to the film 18 at selected locations.

The substrate film carrier 20 has a thickness in the range from about 0.125 mm to 0.120 mm, a length in the range from about 182.03 mm to 182.93 mm and a width in the range from about 27.13 mm to 27.23 mm. However, in other embodiments, the skilled artisan will recognize that the substrate film carrier 20 may be adapted to have a wide variety of other thicknesses, lengths and widths.

The layers 74 may have a thickness in the range from about 0.125 mm to 0.120 mm. However, in other embodiments, the skilled artisan will recognize that the layers 74 may be adapted to have a wide variety of other thicknesses.

The side bars 60, 62 have a thickness in the range from about 0.125 mm to 0.120 mm, a length in the range from about 182.03 mm to 182.93 mm, and a width in the range from about 27.13 mm to 27.23 mm. The side bar teeth 63 extend inwards about 4.32 mm and are about 6.63 mm wide. However, in other embodiments, the skilled artisan will recognize that the side bars 60, 62 may be adapted to have a wide variety of other dimensions.

The end bars 64, 66 have a thickness in the range from about 0.125 mm to 0.120 mm, a length in the range from about 27.13 mm to 27.23 mm, and a width in the range from about 1.03 mm to 1.11 mm. However, in other embodiments, the skilled artisan will recognize that the end bars 64, 66 may be adapted to have a wide variety of other dimensions.

The cross bars 68 have a thickness in the range from about 0.125 mm to 0.120 mm, a length in the range from about 27.13 mm to 27.23 mm, and a width in the range from about 2.11 mm to 2.21 mm. In one embodiment, the spacing between neighboring cross bars 68 is in the range from about 5.03 mm to 5.11 mm. However, in other embodiments, the skilled artisan will recognize that the cross bars 68 may be adapted to have a wide variety of other dimensions and spacings. In one embodiment, the substrate film carrier 20 includes five cross bars 68. However, in other embodiments, the substrate film carrier 20 may include fewer or more cross bars 68.

The carrier indexing holes 70 have a diameter in the range from about 1.574 mm to 1.499 mm. However, in other embodiments, the skilled artisan will recognize that the indexing holes 70 may be adapted to have a wide variety of other diameters. In one embodiment, the carrier 20 includes fifty-four indexing holes 70. However, in other embodiments, the substrate film carrier 20 may include fewer or more indexing holes 70.

Upon completion of at least a portion of the manufacturing process, one embodiment of the invention removes the substrate film carrier 20 from the substrate film 18. Upon removal of the substrate film carrier 20, the substrate units 24 and the their corresponding dies 22 are separated from each other. Thus, the substrate file carrier 20 provides support during the manufacturing process.

The substrate film carrier 20 demonstrates certain advantages over conventional handling of thin substrate films 18. One advantage is that the substrate film carrier 20 provides enhanced rigidity to the substrate film during handling and die-substrate assembly. This reduces undesirable and/or unwanted bending and movement which can not only cause damage to the die, the substrate and the die-substrate interface, but can also complicate the handling and assembly of the die and substrate. For example, undesirable bending of the substrate film can result in breakage of one or more of the lead wires connecting the dies to the substrate film. The substrate film carrier 20 (FIG. 4) improves processability of the die-substrate assembly 17 (FIG. 2) by providing enhanced rigidity to the substrate film 18 (FIGS. 3 and 4), and hence helps in reducing the percentage of defective end products.

Another advantage of the substrate film carrier 20 (FIG. 4) is that it can provide a better seal with a suction/vacuum tip, again largely due to the enhanced rigidity it provides. In some situations during handling of the substrate film 18 (FIGS. 3 and 4) and/or die-substrate assembly 17 (FIG. 2) it is desirable to use a suction tip for holding and/or transporting the substrate film 18 and/or the die-substrate assembly 17. The flimsiness of conventional thin substrate films makes it difficult to use a suction tip. The substrate film carrier 20 (FIG. 4) allows the use of suction tips to handle the substrate film 18 (FIGS. 3 and 4) by providing enhanced rigidity to the substrate film 18. This can improve the overall speed and efficiency of the assembly process.

Another advantage of the substrate film carrier 20 (FIG. 4) is that it allows for more control in selecting the thinness of the substrate film 18 (FIGS. 3 and 4). In general, it is desirable to have a thin substrate film to reduce the weight and size of the end product. But, with some conventional substrate films the lower limit on the thickness can be dictated by the handling processability of the substrate film. This limitation on the thickness of the substrate film is reduced by the substrate film carrier 20 (FIG. 4) which provides enhanced rigidity to the substrate film 18 (FIGS. 3 and 4). Moreover, the degree of rigidity and/or flexibility provided can be controlled by selection of the carrier dimensions, configuration and material choice.

While the components and techniques of the invention have been described with a certain degree of particularity, it is manifest that many changes may be made in the specific designs, constructions and methodology hereinabove described without departing from the spirit and scope of this disclosure. It should be understood that the invention is not limited to the embodiments set forth herein for purposes of exemplification, but is to be defined only by a fair reading of the appended claims, including the full range of equivalency to which each element thereof is entitled.

What is claimed is:

1. A method of manufacturing an assembly comprising:
    combining layers of solder resist other than polyimide with a polyimide film to construct side bars;
    connecting said side bars to a substrate film wherein connecting said side bars comprises substantially aligning a plurality of indexing holes in said side bars with a plurality of indexing holes in said substrate film;
    transporting said side bars and said substrate film through a manufacturing process; and removing said side bars after at least a portion of said manufacturing process.

2. The method of claim 1 wherein said act of connecting said side bars substantially aligns said side bars with side rails in said substrate film.

3. The method of claim 1 further comprising the act of connecting cross bars to said substrate film.

4. The method of claim 3 wherein said act of connecting cross bars substantially aligns said cross bars with cross rails in said substrate film.

5. The method of claim 1 further comprising the act of interfacing said substrate film with a plurality of dies.

* * * * *